(12) United States Patent
Lou

(10) Patent No.: US 7,791,363 B2
(45) Date of Patent: Sep. 7, 2010

(54) LOW TEMPERATURE PROBING APPARATUS

(75) Inventor: Choon Leong Lou, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 34 days.

(21) Appl. No.: 12/401,842

(22) Filed: Mar. 11, 2009

(65) Prior Publication Data

US 2010/0052717 A1 Mar. 4, 2010

(30) Foreign Application Priority Data

Sep. 4, 2008 (TW) .............................. 97133853 A

(51) Int. Cl.
*G01R 31/02* (2006.01)
(52) U.S. Cl. ........................ 324/758; 324/760
(58) Field of Classification Search ............... 324/73.1, 324/158.1, 760–765, 750–758; 438/14–18; 356/399
See application file for complete search history.

(56) References Cited

U.S. PATENT DOCUMENTS

| 6,257,319 | B1 | 7/2001 | Kainuma et al. |
| 7,468,609 | B2 * | 12/2008 | Dunklee ..................... 324/754 |
| 7,700,379 | B2 * | 4/2010 | Haji-Sheikh et al. .......... 438/14 |

* cited by examiner

*Primary Examiner*—Minh N Tang
*Assistant Examiner*—Trung Q Nguyen
(74) *Attorney, Agent, or Firm*—WPAT, P.C.; Anthony King

(57) ABSTRACT

A low temperature probing apparatus comprises a housing, a device holder positioned in the housing and configured to receive at least one semiconductor device under test, a platen positioned on the housing, at least one hydraulic stage positioned on the platen and configured to retain at least one probe, a cover positioned on the platen and configured to form an isolation chamber with the hydraulic stage and the device holder positioned therein, and a hydraulic controller configured to control the movement of the hydraulic stage.

25 Claims, 2 Drawing Sheets

LOW TEMPERATURE PROBING APPARATUS

BACKGROUND OF THE INVENTION (A) Field of the Invention

The present invention relates to a low temperature probing apparatus, and more particularly, to a low temperature probing apparatus using a hydraulic stage to retain the probe unit holding the probes or probe card.

(B) Description of the Related Art

Integrated circuit devices have become the necessary core of every electronic device. This includes the vehicle-control system in the automobile running on the road or at zero degrees Celsius, or the communication system in the airplane flying in the sky in subzero temperatures. The integrated circuit devices inside these electronic systems must operate normally without failing due to the dramatic temperature variation. To verify and qualify whether the integrated circuit devices can operate normally under such low temperatures, the integrated circuit devices have to be tested in an environment under such conditions or at even lower temperature.

Generally, it is necessary to test the electrical characteristics of integrated circuit devices on the wafer level to verify the performance of the integrated circuit device and to satisfies the product specification. Integrated circuit devices with electrical characteristics satisfying the specification will be selected for the subsequent packaging process, and the other devices will be discarded to avoid additional packaging cost. Another electrical property test will be performed on the integrated circuit device after the packaging process is completed to screen out the below-standard devices to increase the product yield. In other words, the integrated circuit devices must undergo several electrical tests during the manufacturing process.

Currently, the method used in the testing of integrated circuit devices includes setting the positions of the device under test and the testing tools prior to isolating the testing room from the environment and using liquid nitrogen to cool the testing room down to the desired testing temperature, and performing the low temperature testing. During the testing, the operator has to move the device or the probe card and manipulator such that the probe of the probe card can contact different devices or different pads of the same device.

However, moving the probe card and the manipulator cannot be achieved until the isolated testing environment is exposed to the surroundings, and exposing the isolated test environment results in the communication of the low-temperature environment with the higher-temperature environment such that moisture condenses into water droplets, influencing actual temperature of the devices under test and also the damages the cooling mechanism that tries to lower the temperature below freezing temperature. The condensed water droplets or ice can further cause a short circuit if it contacts the circuit of the testing tools. In addition, after the test environment is isolated again, the temperature will drop further causing poor contact of the probes on the wafer as the probes skids away from the contact area when the wafer further shrinks from lower temperature.

To solve this problem, researchers try to avoid the opening of the testing room by using the electrical stage instead of the manipulator. However, using the electrical stage to retain the probe or the probe card results in closing of the electrical stage to the device under test or the probe card, and the electromagnetic noise generated from the operation of the electrical stage deeply influences the accuracy of the testing result. Consequently, the use of the electrical stage instead of the manipulator is not feasible. In addition, electrical stage requires electrical power and external control software which may not be feasible in a manual station.

U.S. Pat. No. 6,257,319 discloses an IC testing apparatus for performing at least a low temperature stress to ICs to be tested comprising a refrigerant cycle wherein at least a compressor, condenser, expansion valve and evaporator are connected in order, and a cold air applying line having a blower for supplying heat exchanged cold air by the evaporator to the ICs to be tested. However, U.S. Pat. No. 6,257,319 only teaches how to generate the low temperature testing atmosphere, and does not disclose the solution for the above-mentioned problem.

SUMMARY OF THE INVENTION

One aspect of the present invention provides a low temperature probing apparatus using a hydraulic stage to retain the probe or probe card, which can adjust the positions of the probe or the device under test without opening the testing chamber during the testing process and without using the electric stage to prevent the electromagnetic noise from influencing the accuracy of the testing result.

A low temperature probing apparatus according to this aspect of the present invention comprises a housing, a device holder positioned in the housing and configured to receive at least one semiconductor device under test, a platen positioned on the housing, at least one hydraulic stage positioned on the platen and configured to retain at least one probe, a cover positioned on the platen and configured to form an isolation chamber with the hydraulic stage and the device holder positioned therein, and a hydraulic controller configured to control the movement of the hydraulic stage.

Another aspect of the present invention provides a low temperature probing apparatus comprising a housing, a device holder positioned in the housing and configured to receive at least one semiconductor device under test, a platen positioned on the housing, at least one hydraulic stage positioned on the platen and configured to retain a probe card, a cover positioned on the platen and configured to form an isolation chamber with the hydraulic stage and the device holder positioned therein, and a hydraulic controller configured to control the movement of the hydraulic stage.

The embodiment of the present invention uses the top cover having the transparent window to form the isolation chamber, and therefore the observation of the relative positions of the semiconductor device and the probe can be achieved through the transparent window of the top cover, without opening the testing chamber. In addition, the use of the hydraulic stage to retain the probe or the probe card allows the adjustment of the position of the semiconductor device or the probe without opening the testing chamber such that the condensation of moisture into the water droplets can be avoided. In particular, the embodiment of the present invention uses the hydraulic stage rather than the electric stage to retain the probe, which means no electrical power is required and no electromagnetic noise to influence the accuracy of the testing result.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
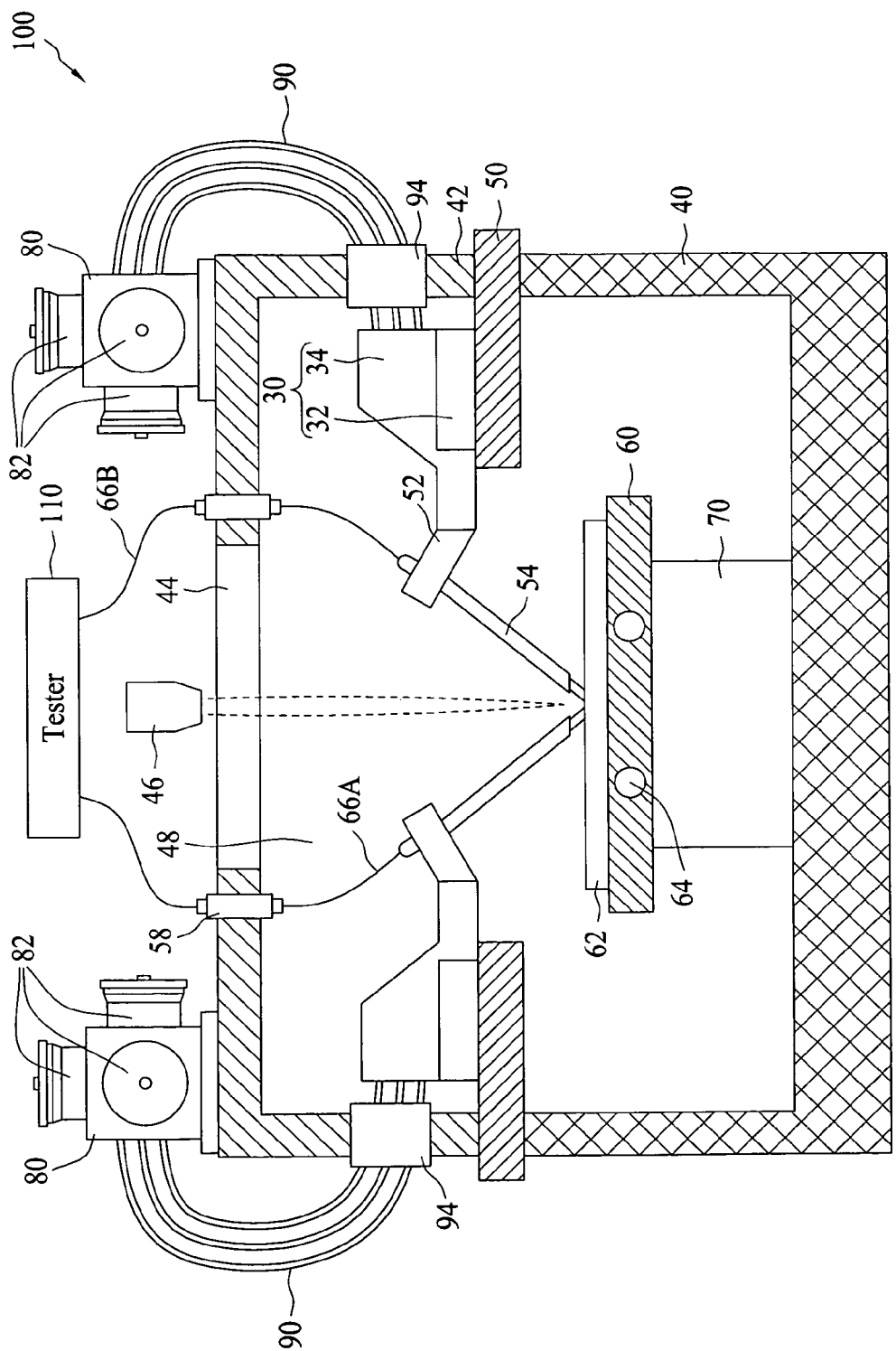
FIG. 1 illustrates a low temperature probing apparatus according to one embodiment of the present invention.

FIG. 1 illustrates a low temperature probing apparatus 100 according to one embodiment of the present invention. The low temperature probing apparatus 100 comprises a housing 40, a stand 70 positioned in the housing 40, a device holder 60 positioned in the housing 40 and configured to receive at least one device under test such as the semiconductor device 62, a temperature-controlling device such as the heater 64 positioned in the device holder 60 and configured to control the temperature of the semiconductor device 62, a platen 50 positioned on the housing 40, at least one hydraulic stage 30 positioned on the platen 50, a cover 42 positioned on the platen 50 and configured to form an isolation chamber 48 with the hydraulic stage 30 and the device holder 60 positioned therein, and a hydraulic controller 80 configured to control the movement of the hydraulic stage 30.

The hydraulic stage 30 is configured to retain at least one probe 54. In one embodiment of the present invention, a sleeve (or a hydraulic connector) 94 is positioned on the cover 42, and the hydraulic tubes 90 connect the hydraulic controller 80 and the hydraulic stage 30 through the sleeve (or the hydraulic connector) 94. The cover 42 has a transparent window 44 for observing the relative position of the semiconductor device 62 and the probe 54. In one embodiment of the present invention, the transparent window 44 includes glass or plastic. In addition, the low temperature probing apparatus 100 may further include an image-capturing device 46 configured to capture an alignment image of the semiconductor device 62 and the probe 54 through the transparent window 44 of the cover 14, such that the operator can adjust the position of the probe 54 by use of the hydraulic stage 30.

In one embodiment of the present invention, the hydraulic stage 30 includes a stationary member 32 and a movable member 34 positioned on the stationary member 32. The stationary member 32 is positioned on the platen 50, and the movable member 34 is configured to retain the probe 54 by using a carrier such as a probe holder 52. The hydraulic controller 80 can be positioned on the cover 42 and configured to control the movement of the hydraulic stage 30 through a plurality of hydraulic tubes 90 by rotating the adjustment knobs 82. In one embodiment of the present invention, an electrical connector (or a sleeve) 58 is positioned on the cover 42, and the probe 54 is electrically connected to a tester 110 through the electrical connector (or a sleeve) 58 and conductive wires 66A, 66B.

Figure 2:
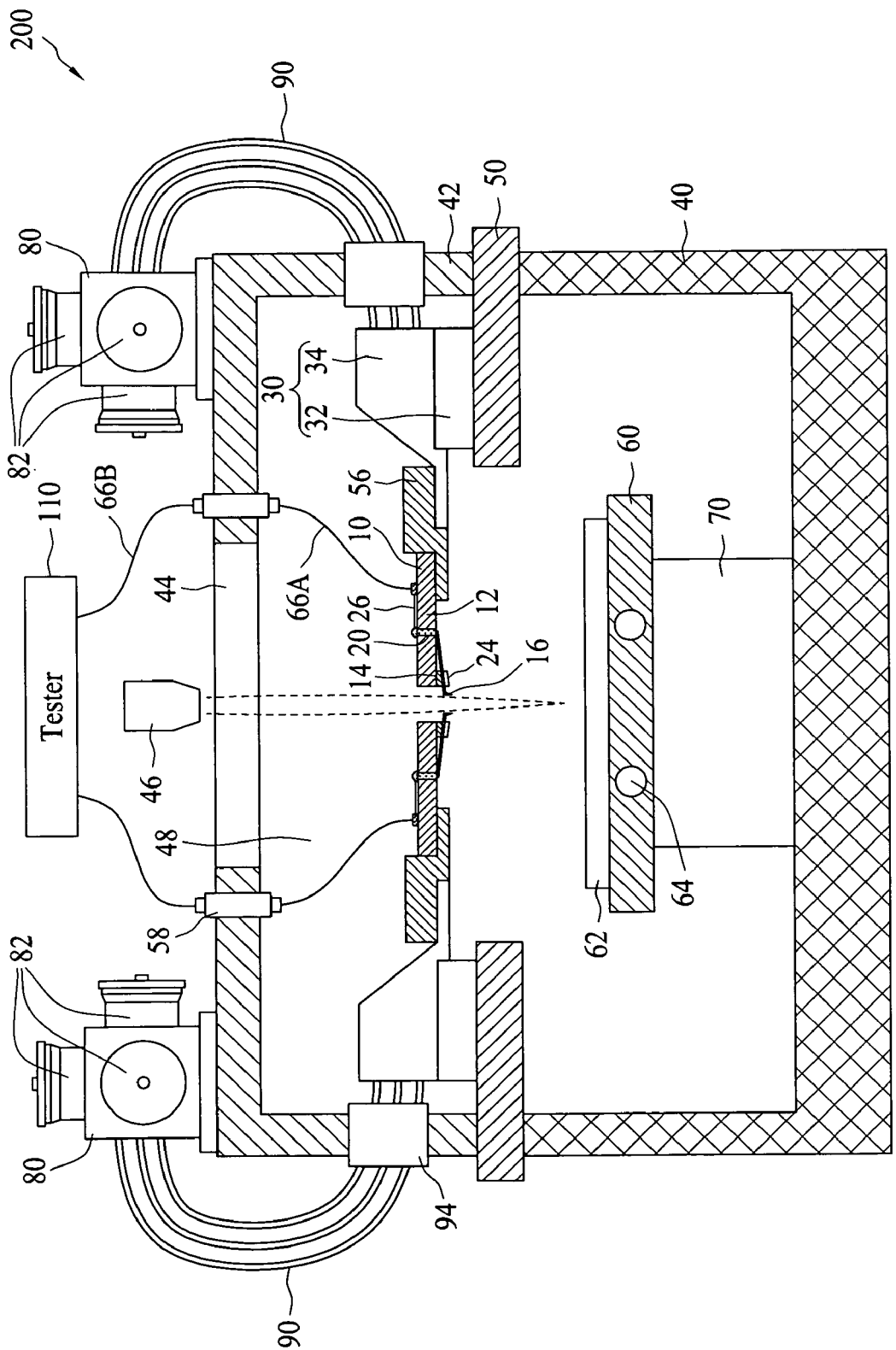
FIG. 2 illustrates a low temperature probing apparatus according to another embodiment of the present invention.

FIG. 2 illustrates a low temperature probing apparatus 200 according to another embodiment of the present invention. The low temperature probing apparatus 200 comprises a housing 40, a stand 70 positioned in the housing 40, a device holder 60 positioned in the housing 40 and configured to receive at least one device under test such as the semiconductor device 62, a temperature-controlling device such as the heater 64 positioned in the device holder 60 and configured to control the temperature of the semiconductor device 62, a platen 50 positioned on the housing 40, at least one hydraulic stage 30 positioned on the platen 50, a cover 42 positioned on the platen 50 and configured to form an isolation chamber 48 with the hydraulic stage 30 and the device holder 60 positioned therein, and a hydraulic controller 80 configured to control the movement of the hydraulic stage 30.

In one embodiment of the present invention, the hydraulic stage 30 is configured to retain a probe card 10 and includes a stationary member 32 and a movable member 34 positioned on the stationary member 32. The stationary member 32 is positioned on the platen 50, and the movable member 34 is configured to retain the probe card 10 by using a carrier such as a card holder 56. The hydraulic controller 80 can be positioned on the cover 42 and configured to control the movement of the hydraulic stage 30 through a plurality of hydraulic tubes 90 by rotating the adjustment knobs 82. In one embodiment of the present invention, a sleeve (or a hydraulic connector) 94 is positioned on the cover 42, and the hydraulic tubes 90 connect the hydraulic controller 80 and the hydraulic stage 30 through the sleeve (or the hydraulic connector) 94.

In one embodiment of the present invention, the probe card 10 includes a substrate 12, a supporter 14 positioned on the substrate 12, a plurality of probes 16 positioned on the supporter 14, and a conductive through hole 20 connecting the probe 16 and a conductive wire 26. The probe 16 is fixed on the supporter 14 by epoxy resin 24. The cover 42 has a transparent window 44 for observing the relative position of the semiconductor device 62 and the probe 16. In one embodiment of the present invention, an electrical connector (or a sleeve) 58 is positioned on the cover 42, and the probe card 10 is electrically connected to a tester 110 through the electrical connector (or a sleeve) 58 and conductive wires 66A, 66B.

In one embodiment of the present invention, the transparent window 44 includes glass or plastic. In addition, the low temperature probing apparatus 100 may further include an image-capturing device 46 configured to capture an alignment image of the semiconductor device 62 and the probe 16 through the transparent window 44 of the cover 14, such that the operator can adjust the position of the probe 16 by use of the hydraulic stage 30.

The embodiment of the present invention uses the top cover 42 having the transparent window 44 to form the isolation chamber 48, and therefore the observation of the relative position of the semiconductor device 62 and the probe 54, 16 can be achieved through the transparent window 44 of the top cover 42, without opening the isolation chamber 48. In addition, the use of the hydraulic stage 30 to retain the probe 54 or the probe card 10 allows the adjustment of the position of the semiconductor device 62 or the probe 54 by the hydraulic stage 30 without opening the isolation chamber 48 such that the condensation of moisture can be avoided. In particular, the embodiment of the present invention uses the hydraulic stage 30 rather than the electric stage to retain the probe 54 or the probe card 10, resulting in no electromagnetic noise to influence the accuracy of the testing result.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A low temperature probing apparatus, comprising:
a housing;
a device holder positioned in the housing and configured to receive at least one semiconductor device under test;
a platen positioned on the housing;
at least one hydraulic stage positioned on the platen and configured to retain at least one probe;
a cover positioned on the platen and configured to form an isolation chamber with the hydraulic stage and the device holder positioned therein; and
a hydraulic controller outside the housing and configured to control the movement of the hydraulic stage.

2. The low temperature probing apparatus of claim 1, wherein the cover include a transparent window.

3. The low temperature probing apparatus of claim 2, further comprising an image-capturing device configured to capture an alignment image of the semiconductor device and the probe through the transparent window.

4. The low temperature probing apparatus of claim 2, wherein the transparent window includes glass or plastic.

5. The low temperature probing apparatus of claim 1, wherein the hydraulic stage includes a stationary member positioned on the platen and a movable member configured to retain the probe.

6. The low temperature probing apparatus of claim 5, wherein the movable member includes a carrier configured to retain the probe.

7. The low temperature probing apparatus of claim 1, wherein the probe is connected to a tester through an electrical connector positioned on the cover.

8. The low temperature probing apparatus of claim 1, wherein the probe is connected to a tester through a sleeve positioned on the cover.

9. The low temperature probing apparatus of claim 1, wherein the hydraulic controller is configured to control the movement of the hydraulic stage by at least one hydraulic tube.

10. The low temperature probing apparatus of claim 9, wherein the hydraulic tube connects the hydraulic controller to the hydraulic stage through a sleeve positioned on the cover.

11. The low temperature probing apparatus of claim 9, wherein the hydraulic tube connects the hydraulic controller to the hydraulic stage through a hydraulic connector positioned on the cover.

12. The low temperature probing apparatus of claim 1, wherein the hydraulic controller is positioned on the cover.

13. A low temperature probing apparatus, comprising:
a housing;
a device holder positioned in the housing and configured to receive at least one semiconductor device under test;
a platen positioned on the housing;
at least one hydraulic stage positioned on the platen and configured to retain a probe card;
a cover positioned on the platen and configured to form an isolation chamber with the hydraulic stage and the device holder positioned therein; and
a hydraulic controller configured to control the movement of the hydraulic stage.

14. The low temperature probing apparatus of claim 13, wherein the cover include a transparent window.

15. The low temperature probing apparatus of claim 14, further comprising an image-capturing device configured to capture an alignment image of the semiconductor device and a probe of the probe card through the transparent window.

16. The low temperature probing apparatus of claim 14, wherein the transparent window includes glass or plastic.

17. The low temperature probing apparatus of claim 13, wherein the hydraulic stage includes a stationary member positioned on the platen and a movable member configured to retain the probe card.

18. The low temperature probing apparatus of claim 17, wherein the movable member includes a carrier configured to retain the probe card.

19. The low temperature probing apparatus of claim 13, wherein the probe card is connected to a tester through an electrical connector positioned on the cover.

20. The low temperature probing apparatus of claim 13, wherein the probe card is connected to a tester through a sleeve positioned on the cover.

21. The low temperature probing apparatus of claim 13, wherein the hydraulic controller is configured to control the movement of the hydraulic stage by at least one hydraulic tube.

22. The low temperature probing apparatus of claim 21, wherein the hydraulic tube connects the hydraulic controller to the hydraulic stage through the sleeve positioned on the cover.

23. The low temperature probing apparatus of claim 21, wherein the hydraulic tube connects the hydraulic controller to the hydraulic stage through a hydraulic connector positioned on the cover.

24. The low temperature probing apparatus of claim 13, wherein the hydraulic controller is positioned on the cover.

25. The low temperature probing apparatus of claim 13, wherein the probe card includes a substrate and at least one probe positioned on the substrate.

* * * * *